United States Patent [19]

Ohmura et al.

[11] Patent Number: 4,500,388
[45] Date of Patent: Feb. 19, 1985

[54] METHOD FOR FORMING MONOCRYSTALLINE SEMICONDUCTOR FILM ON INSULATING FILM

[75] Inventors: Yamichi Ohmura, Sagamihara; Yoshiaki Matsushita, Kawasaki, both of Japan

[73] Assignee: Tokyo Shibaura Denki Kabushiki Kaisha, Kawasaki, Japan

[21] Appl. No.: 445,265

[22] Filed: Nov. 29, 1982

[30] Foreign Application Priority Data

Nov. 30, 1981 [JP] Japan ................................. 56-190628

[51] Int. Cl.³ ............................................... C30B 1/04
[52] U.S. Cl. ............................. 156/603; 156/DIG. 65
[58] Field of Search ....... 156/603, 605, 606, DIG. 88, 156/DIG. 73, DIG. 65; 148/1.5; 427/86, 85

[56] References Cited

U.S. PATENT DOCUMENTS 4,147,584 4/1979 Garrison et al. ..................... 156/603
4,383,883 5/1983 Mizutani ............................... 156/603

FOREIGN PATENT DOCUMENTS 56-67923 6/1981 Japan .
56-73697 6/1981 Japan .

Primary Examiner—Hiram H. Bernstein
Attorney, Agent, or Firm—Oblon, Fisher, Spivak, McClelland & Maier

[57] ABSTRACT

A monocrystalline semiconductor film is formed on an insulating film first by selectively forming at least one insulating film which has sides substantially perpendicular to $<100>$ or $<211>$-axes, contiguous to a cubic crystal system monocrystalline semiconductor substrate. An amorphous film of a cubic crystal system semiconductor material is formed to cover an exposed surface of substrate and the insulating film. The amorphous semiconductor film is annealed under a condition such that the amorphous film is grown from the substrate by solid-phase epitaxial growth, thereby converting the amorphous film to a monocrystalline semiconductor film having a crystal lattice continuous to that of the substrate.

12 Claims, 5 Drawing Figures

METHOD FOR FORMING MONOCRYSTALLINE SEMICONDUCTOR FILM ON INSULATING FILM

BACKGROUND OF THE INVENTION

I. Field of the Invention

The present invention relates to a method for forming a monocrystalline semiconductor film on an insulating film and, more particularly, to a method for forming a monocrystalline semiconductor thin film which has a crystal lattice continuous to that of a monocrystalline substrate and which is formed on an insulating film formed on the monocrystalline substrate.

II. Description of the Prior Art

A monocrystalline semiconductor thin film formed on an insulating film has various advantages, as may be apparent in the case of silicon on sapphire (SOS). The monocrystalline semiconductor thin film can be physically isolated in an island shape or can be isolated using a dielectric so as to readily and completely achieve isolation of a semiconductor element formed in the monocrystalline semiconductor thin film. When an impurity is doped in the monocrystalline semiconductor thin film to a depth corresponding to an interface between the thin film and the insulating film, an area of a formed p-n junction becomes very small, thus decreasing a parasitic capacitance. As a result, high-speed operation of the element can be performed. Furthermore, when a MOS inverter is formed on the monocrystalline semiconductor thin film, the switching speed of the MOS inverter is increased since the substrate bias effect is not present. In addition, when the insulating film is a dielectric thin film formed on the monocrystalline semiconductor substrate, and the monocrystalline semiconductor thin film is connected to the monocrystalline semiconductor substrate through a groove or opening formed in the dielectric thin film, an electrical resistance is decreased. Thus, the above structure has more advantages than a structure in which a polycrystalline semiconductor thin film is formed on a dielectric thin film.

The structure in which a monocrystalline semiconductor thin film formed on an insulating film continues to a monocrystalline semiconductor substrate has been achieved by laser annealing to some extent. For example, such a structure is disclosed in Japanese Patent Disclosure (Kokai) No. 56-67923 (laid-open to the public on June 8, 1981) in which an insulating film having a groove is formed on a monocrystalline silicon substrate, a polycrystalline or amorphous semiconductor film is deposited to cover the insulating film including the groove, and the polycrystalline or amorphous film is scanned with a laser beam. The polycrystalline or amorphous semiconductor film is melted within a short period of time by radiation of laser beams. As a result, a monocrystalline thin film is grown on the insulating film using the monocrystalline semiconductor substrate as a seed crystal.

However, in the above technique utilizing recrystallization of the molten material, the molten material tends to gather on the insulating film. Thus, when the polycrystalline or amorphous semiconductor film is very thin, a continuous monocrystalline semiconductor thin film cannot be obtained. Further, since the polycrystalline or amorphous semiconductor thin film is first melted and then solidified, the obtained monocrystalline semiconductor thin film often will not have a smooth surface. Since a relatively high temperature is required to melt the polycrystalline or amorphous semiconductor thin film, atoms of a different type are diffused from the monocrystalline semiconductor substrate when the monocrystalline semiconductor substrate comprises a material different from that of the polycrystalline or amorphous semiconductor thin film. As a result, the obtained monocrystalline semiconductor thin film is contaminated.

SUMMARY OF THE INVENTION

It is, therefore, an object of the present invention to provide a method for uniformly forming a monocrystalline semiconductor thin film which has a crystal lattice continuous to that of a monocrystalline semiconductor thin film and which is formed on an insulating film contiguous to the monocrystalline semiconductor substrate.

It is another object of the present invention to provide a method for uniformly forming such a monocrystalline semiconductor thin film at a relatively low temperature.

In order to achieve the above objects of the present invention, solid-phase epitaxial growth is utilized to convert an amorphous semiconductor to a monocrystalline semiconductor. An insulating film has sides substantially perpendicular to the $<100>$-axes or the $<211>$-axes. This insulating film is formed contiguous to the monocrystalline semiconductor substrate and then an amorphous semiconductor thin film is formed thereon. The amorphous semiconductor thin film formed on the insulating film is grown by solid-phase epitaxial growth to a monocrystalline semiconductor thin film having a crystal lattice continuous to that of the monocrystalline semiconductor substrate.

According to the present invention, since solid-state epitaxial growth is utilized, the obtained monocrystalline semiconductor thin film does not have a rough surface. Further, since solid-phase epitaxial growth is performed at a relatively low temperature, atoms may not be diffused from the monocrystalline semiconductor substrate. Since the crystal of the insulating film has sides substantially perpendicular to the $<100>$-directions or the $<211>$-directions, solid-phase epitaxial growth is smoothly performed. As a result, a uniform monocrystalline semiconductor thin film can be obtained.

DETAILED DESCRIPTION OF THE PREFERRED EMBODIMENTS

In seeking to solve the conventional problems and to provide a method for uniformly forming a cubic system type monocrystalline semiconductor thin film on an insulating film formed contiguous to a monocrystalline semiconductor substrate, the present inventors have adopted the solid-phase epitaxial growth method. The solid-phase epitaxial growth method is essentially different from the liquid-phase epitaxial growth method in which a molten material is recrystallized. However, a uniform monocrystalline semiconductor structure cannot be formed on the insulating film simply by utilizing solid-phase epitaxial growth. More specifically, after a silicon dioxide film was formed on a monocrystalline silicon substrate and an amorphous silicon film was formed to cover the silicon dioxide film, solid-phase epitaxial growth was performed at a temperature of 500° to 600° C. The resultant thin film on the insulating film was often a mixture of monocrystalline silicon having a continuous crystal lattice and a substantial amount of polycrystalline silicon. This is considered to be attributed to the following reason. Amorphous silicon is epitaxially grown, and the epitaxial layer grows to extend in the horizontal direction. Meanwhile, a crystal whose index of plane is independent of that of the silicon substrate is formed on the insulating film or at the edges thereof. The epitaxially grown crystal in the vertical direction must then grow in the horizontal direction especially at the edges of the insulating film.

As a result of an extensive study on solving the above problems concerning the solid-phase epitaxial growth method, when the insulating film has sides substantially perpendicular to the <100>-directions or the <211>-directions, it is found that the amorphous semiconductor film on the insulating film is epitaxially grown as a uniform monocrystalline semiconductor thin film using the monocrystalline semiconductor substrate as the seed crystal. Solid-phase growth tends to occur along the <100>-directions or axes or the <211>-directions or axes.

The present invention will be described in detail with reference to the accompanying drawings.

Figure 1:
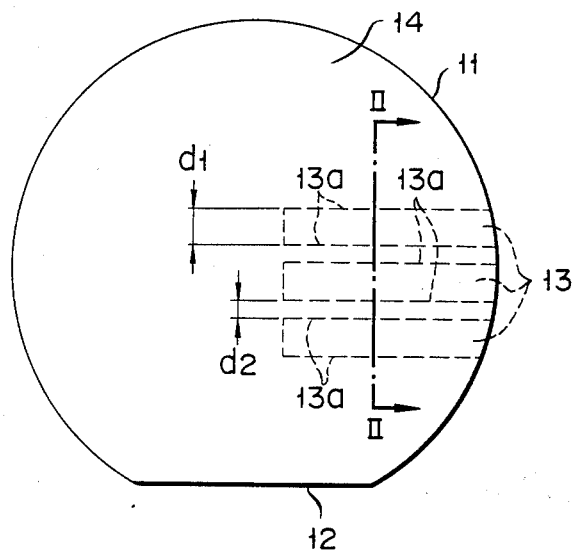
FIG. 1 is a plan view showing a structure according to an embodiment of the present invention.

As shown in FIG. 1, a monocrystalline or single crystal semiconductor wafer or substrate 11 is prepared. Since the present invention aims at forming a cubic crystal system monocrystalline semiconductor thin film on an insulating film, the semiconductor wafer 11 comprises a cubic crystal system semiconductor material such as silicon, germanium, or a III-V Group compound semiconductor (e.g., GaAs and InP). An orientation flat 12 is formed at the wafer 11.

Insulating films 13 of a uniform thickness of, e.g., 0.1 μm to 1 μm each of which has sides substantially perpendicular to the <100>-axes or the <211>-axes are formed on selected regions of the wafer 11. Generally, the insulating film 13 is formed in a strip form which has two elongated parallel sides 13a which are perpendicular to the <100>-axes or the <211>-axes. The sides 13a may be parallel to the orientation flat 12. However, the present invention is not limited to the above structure. The insulating film 13 is formed by forming an insulating material such as silicon dioxide ($SiO_2$) or silicon nitride ($Si_3N_4$) on the wafer 11 and by photoetching the insulating material. The other insulating materials may be used.

It is known that the condition $[hkl][h'k'l'] = h \cdot h' + k \cdot k' + l \cdot l' = 0$ must be satisfied if a specific direction [hkl] of a crystal is to be perpendicular to another specific direction [h'k'l'] (in this case, <100>-axes or <211>-axes) in the cubic crystal system. Furthermore, the condition $[uvw][u'v'w'] = 0$ (in this case, the [uvw] direction of the crystal is normal to the (uvw) plane) must be satisfied if the (uvw) plane is to include a specific direction [u'v'w'] (in this case, the <100>-axes or <211>-axes). The directions of the sides 13a of the insulating film 13 and the planes of the wafer 11 as well as, if desired, the direction of the orientation flat 12 are determined according to the above conditions. The typical planes of the wafer 11 are the (110), (111) and (100) planes. It is noted that the directions of the sides 13a of the insulating film 13 need not be accurately perpendicular to the <100>-axes and the <211>-axes. Deviations of up to 5° to 6° are acceptable in the invention.

A width $d_1$ of the insulating strip film 13 usually falls within a range of 2 μm to 20 μm. A distance $d_2$ between adjacent insulating films 13 falls within a range of 1 μm to 5 μm. Usually, the long side 13a has a length of about 5 mm to about 25 mm. It is noted that the insulating films 13 may be formed on the entire surface of the wafer 11.

Figure 2:
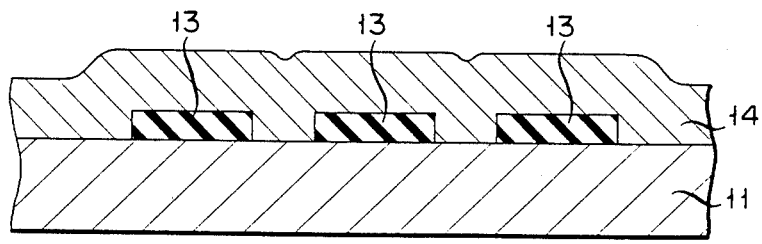
FIG. 2 is a slightly enlarged sectional view of the structure taken along the line II—II in FIG. 1.

Thereafter, as best shown in FIG. 2, an amorphous semiconductor thin film 14 of a cubic system is formed to cover the entire surface to a thickness of, e.g., 0.1 μm to 1 μm. The amorphous semiconductor comprises the cubic system semiconductor material described above. The amorphous semiconductor thin film 14 is directly formed by vapor deposition. Alternatively, the amorphous semiconductor thin film 14 may be formed such that a polycrystalline semiconductor thin film is deposited by low pressure chemical vapor deposition (LPCVD) (e.g., polycrystalline silicon formed by decomposing silane), and ions (silicon ions for polycrystalline silicon) are ion-implanted to destroy regularity of the crystal lattice to form amorphous silicon.

The obtained structure shown in FIG. 2 is annealed in an inert gas (e.g., nitrogen gas) atmosphere to solid-phase epitaxially grow the amorphous semiconductor thin film 14 to a monocrystalline silicon thin film. This annealing is performed at a temperature and for a period of time sufficient to grow the monocrystalline semiconductor thin film without causing the amorphous semiconductor thin film 14 to melt. The annealing temperature may vary in accordance with the cubic system semiconductors used, but generally is a temperature below a melting point T (°K.) of the semiconductor and above a temperature corresponding to $\frac{1}{2}$ T (°K.). When silicon is used, annealing is performed at a temperature falling within a range of 450° C. to 1000° C., and preferably 500° C. to 700° C., for 1 to 200 hours. When germanium is used, annealing is performed at a temperature falling within a range of 300° C. to 800° C., and preferably 400° C. to 600° C., for 1 to 100 hours. When GaAs is used, annealing is performed at a temperature falling within a range of 500° C. to 1000° C., and preferably 600° C. to 800° C., for 1 to 100 hours. When InP is used, annealing is performed at a temperature falling within a range of 500° C. to 1000° C., and preferably 600° C. to 800° C., for 1 to 100 hours.

The amorphous semiconductor thin film 14 is thus annealed and is solid-phase epitaxially grown using the wafer 11 as the seed crystal to the monocrystalline semiconductor thin film starting from the portion directly contacting the wafer 11.

Heat for annealing may be supplied by heat energy from a heater or laser.

Figure 3:
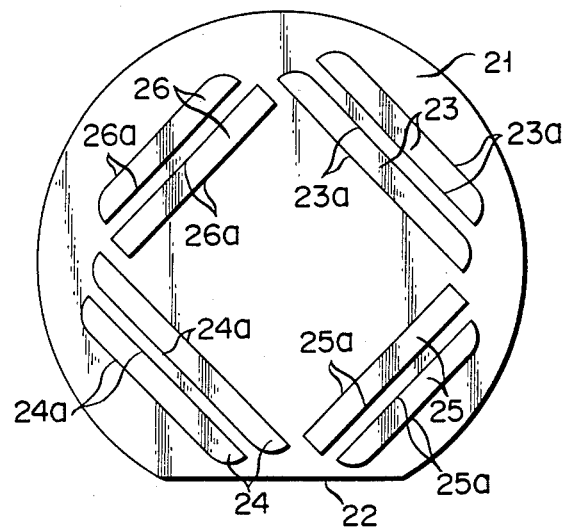
FIGS. 3 and 4 are respectively a plan view and a sectional view of structures according to the other embodiments of the present invention.

FIG. 3 is a plan view of a structure in which four pairs of insulating films 23, 24, 25 and 26 are formed on a wafer 21 having an orientation flat 22. The insulating films 23 and 24 which are parallel to each other are perpendicular to the insulating films 25 and 26 which are parallel to each other. For example, the wafer 21 has an orientation flat in the [011] direction of the crystal. The wafer crystal has the (100) plane. The insulating films 23 and 24 respectively have long sides 23a and 24a which are perpendicular to the [011] direction of the crystal. The insulating films 25 and 26 respectively have long sides 25a and 26a which are perpendicular to the [010] direction. The amorphous semiconductor thin film 5 formed on the above structure can be grown by solid-phase epitaxial growth to a monocrystalline semiconductor according to the present invention.

Figure 4:
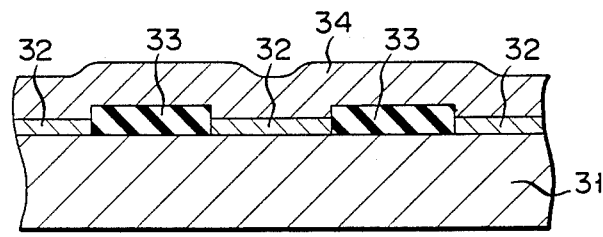

FIG. 4 shows a section showing substrate regions 32 as seed crystals between adjacent insulating films or strips 33. In order to obtain the above structure, a plurality of insulating films are selectively formed on a support 31 formed of a cubic crystal system monocrystalline semiconductor. A monocrystalline silicon layer is deposited on the support 31 and a polycrystalline silicon layer is deposited on the insulating films 33 to a thickness smaller than that of the monocrystalline silicon layer on the support 31, using the CVD method based on the reaction between silicon tetrachloride ($SiCl_4$) and hydrogen ($H_2$). Thereafter, silicon ions are ion-implanted in the polycrystalline silicon layer which is then converted to an amorphous film 34. As a result, monocrystalline silicon regions or substrates 32 are respectively left in the lower layers between the insulating films 33. Even in this case, the amorphous film 34 can be grown by solid-phase epitaxial growth to a monocrystalline semiconductor.

EXAMPLE 1

A monocrystalline silicon wafer having the plane (111) and its orientation flat in the [1$\bar{1}$0] direction of a crystal was prepared. The wafer was thermally oxidized in a dry oxygen atmosphere at a temperature of 1,000° C. for about 2.5 hours to form a silicon dioxide film having a thickness of about 1,000 Å. The silicon dioxide film was etched by photolithography along the direction of the orientation flat, that is, along the [1$\bar{1}$0] direction, to form parallel grooves each having a width of 3 $\mu$m. Thus, the $SiO_2$ strips as shown in FIG. 1 were formed. Each of the $SiO_2$ strips had a width of 30 $\mu$m. Exposed surface portions of silicon were sufficiently cleaned. Thereafter, a polycrystalline silicon film was deposited by the LPCVD method to cover the entire surface to a thickness of 3,000 Å. After annealing was then performed at a temperature of 1,000 °C. for 30 minutes, silicon ions were ion-implanted at an acceleration voltage of 200 KeV and at a dose of $5\times 10^{16}$ $cm^{-2}$, reaching the polycrystalline/monocrystalline interface, to convert the polycrystalline silicon film to an amorphous silicon film. The wafer was then annealed in a nitrogen atmosphere at a temperature of 600° C. for 6,000 minutes. Thereafter, the wafer was etched from the side of the monocrystalline silicon substrate and was made thin, and silicon deposited on the $SiO_2$ strips was examined by a transmission electron microscope. As a result, about 80% of deposited silicon was monocrystalline having the (111) plane. The remainder, that is, about 20%, comprised crystal grains which had the indices of plane different from that of the substrate and which were produced by crystal formation on and at the edges of the $SiO_2$ strips. When the direction of the $SiO_2$ strips was deviated by at least an angle of 5° from the [1$\bar{1}$0] direction, a monocrystalline silicon thin film portion on the (111) plane on the $SiO_2$ strips was found to be decreased.

As a comparison, another type of $SiO_2$ strips were formed in the same manner as described above, except that the long sides of the $SiO_2$ strips were formed to be parallel to the [112] direction, that is, to the <211>-axes. As a result, a monocrystalline silicon portion on the $SiO_2$ strips on the (111) plane was as small as 50%.

The above results indicate that solid-phase epitaxial growth in the direction of the short sides of the $SiO_2$ strips is effectively performed if the [112] direction of a crystal which corresponds to the direction for fast epitaxial growth is aligned perpendicular to the direction of long sides of the $SiO_2$ strips when epitaxial growth occurs in the direction of the short sides from the edges of the $SiO_2$ strips.

Figure 5:
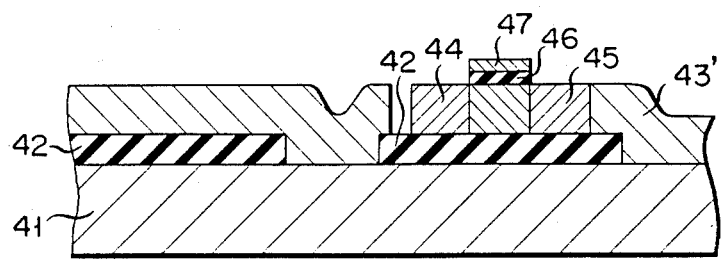
FIG. 5 is a sectional view of a semiconductor device formed in the monocrystalline semiconductor thin film formed by a method of the present invention.

As shown in FIG. 5, monocrystalline silicon film (p-type) formed as above on a silicon oxide film 42 on a wafer 41 was physically isolated. N-type regions 44 and 45 were formed in one monocrystalline silicon films 43'. A gate insulating film 46 was formed on the monocrystalline silicon film 43' between the n-type regions 44 and 45. A gate electrode 47 was then deposited on the gate insulating film 46. Thus, an n-channel MOSFET was prepared. A channel length of the n-channel MOSFET was 4 $\mu$m, and a channel width thereof was 6 $\mu$m. A field effect electron mobility $\mu_{FE}$ of the transistor formed in the monocrystalline silicon film portion 43' was 500 $cm^2$/V.sec, which was close to a maximum field effect electron mobility $\mu_{FE}$ (650 $cm^2$/V.sec) of an n-channel MOSFET which was formed in p-type bulk silicon having the (111) plane.

EXAMPLE 2

A silicon wafer was prepared which had the (110) plane and an orientation flat along the [1$\bar{1}$0] direction of a crystal. The wafer was then oxidized in the same manner as in Example 1. An oxide film was formed on the silicon wafer to a thickness of 1,000 Å. The oxide film was photoetched to form parallel grooves each having a width of 3 $\mu$m. These grooves were formed along the direction [1$\bar{1}$0] of the orientation flat. Each of the remaining $SiO_2$ strips had a width of 30 $\mu$m. Thereafter, the wafer was treated in an aqueous solution of $HF:H_2O = 1l:100$, and was then placed in a vacuum deposition apparatus which was evacuated to a pressure of $1\times 10^{-8}$ Torr. Silicon was deposited to a thickness of 3,000 Å at a rate of 15 Å/sec to form an amorphous silicon film. Annealing was performed in a nitrogen atmosphere at a temperature of 600° C. for 6,000 minutes to grow the amorphous silicon film by solid-phase epitaxial growth. The wafer was etched from the lower surface in the same manner as in Example 1, and was examined by the transmission electron microscope. As a result, about 85% of the silicon film on the $SiO_2$ strips was monocrystalline having (110) plane continuous to the monocrystalline silicon substrate at the grooves. The remainder (15%) consisted of crystal grains of 3 to 20 $\mu$m diameter. The index of plane and the direction of the remainder was of polycrystalline silicon which had nothing to do with the substrate having the (110) plane. The direction of the grooves was gradually deviated from the [1$\bar{1}$0] direction. When a deviation angle exceeded about 6°, the monocrystalline silicon portion on the $SiO_2$ strips was decreased to about 50%. According to these results, it is found that the direction from the grooves to the $SiO_2$ strips corresponds to the <100>-axes, that is, the direction perpendicular to the [001] direction when the grooves are formed in the [1$\bar{1}$0] direction, thus resulting in the direction along which monocrystalline silicon is easily grown. Furthermore, since the (100) plane includes the <100>-axes, monocrystalline silicon can be easily grown on the SiO$_2$ strips.

EXAMPLE 3

A silicon wafer was prepared having the (100) plane and an orientation flat in the [011] direction. This wafer was thermally oxidized to grow an oxide film having a thickness of 1,000 Å in the same manner as in the previous examples. Thereafter, parallel grooves each having a width of 3 μm were formed to leave SiO$_2$ strips each having a width of 30 μm, as shown in FIG. 3. In the same manner as in Example 1, a surface treatment was performed and amorphous silicon was vacuum-deposited to a thickness of 3,000 Å. The wafer was then annealed for solid-phase epitaxial growth in a nitrogen atmosphere at a temperature of 590° C. for 6,000 minutes. The wafer was then examined by the transmission electron microscope. When the direction of the grooves corresponded to the [010] or [001] direction, about 85% of the silicon thin film on the SiO$_2$ strips consisted of monocrystalline silicon having the (100) plane and was continuous to the monocrystalline silicon substrate portions in the grooves. However, when the direction of the grooves was deviated from the [010] or [001] direction, the amount of monocrystalline silicon having the (100) plane was decreased. When the direction of the grooves corresponded to the [01$\bar{1}$] direction which was perpendicular to the orientation flat, the ratio of monocrystalline silicon having the (100) plane was decreased to about 50%.

As described above, since the insulating films or strips having long sides perpendicular to the <100>-axes or the <211>-axes are formed, epitaxial growth can be smoothly performed according to the present invention, thus obtaining a uniform monocrystalline semiconductor film on the insulating strips.

In the above embodiment, a single layer monocrystallization is described. However, by repeating the process described above, a multi-layer structure IC can be manufactured.

What we claim is:

1. A method for forming a monocrystalline semiconductor film on an insulating film, comprising the steps of:

selectively forming at least one insulating film which has sides substantially perpendicular to <100> or <211>-axes, contiguous to a cubic crystal system monocrystalline semiconductor substrate;

forming an amorphous film of a cubic crystal system semiconductor material to cover an exposed surface of said substrate and said insulating film; and annealing said amorphous semiconductor film under a condition such that said amorphous film is grown from said substrate by solid-phase epitaxial growth, thereby converting said amorphous film to a monocrystalline semiconductor film having a crystal lattice continuous to that of said substrate.

2. A method according to claim 1, wherein said insulating film is formed in a strip form which has a uniform thickness and parallel long sides substantially perpendicular to the <100> or <211>-axes.

3. A method according to claim 2, wherein said insulating film has long sides substantially perpendicular to the <211>-axes.

4. A method according to claim 2, wherein said insulating film has long sides substantially perpendicular to the <100>-axes.

5. A method according to claim 2, wherein said amorphous film is formed by vacuum-depositing a cubic crystal system semiconductor material.

6. A method according to claim 2, wherein said amorphous film is formed by forming a polycrystalline film of a cubic crystal system semiconductor material and then ion-implanting to destroy the polycrystalline lattice.

7. A method according to claim 2, wherein said insulating film comprises silicon oxide or silicon nitride.

8. A method according to claim 2, wherein said cubic crystal system semiconductor is a member selected from the group consisting of silicon, germanium, and a III-V Group compound semiconductor.

9. A method according to claim 2, wherein said substrate has a (111) plane.

10. A method according to claim 2, wherein said substrate has a (110) plane.

11. A method according to claim 2, wherein said substrate has a (100) plane.

12. A method according to claim 2, wherein said annealing is conducted at a temperature below a melting point T (°K.) of the semiconductor material comprising the amorphous film and above $\frac{1}{2}$ T (°K.).

* * * * *